United States Patent
Lakus-Becker et al.

(10) Patent No.: US 9,407,293 B2
(45) Date of Patent: Aug. 2, 2016

(54) WYNER ZIV CODING

(75) Inventors: Axel Lakus-Becker, Artarmon (AU); Ka-Ming Leung, Marsfield (AU)

(73) Assignee: CANON KABUSHIKI KAISHA, Tokyo (JP)

( * ) Notice: Subject to any disclaimer, the term of this patent is extended or adjusted under 35 U.S.C. 154(b) by 309 days.

(21) Appl. No.: 12/743,049

(22) PCT Filed: Nov. 27, 2008

(86) PCT No.: PCT/AU2008/001755
§ 371 (c)(1),
(2), (4) Date: Jun. 7, 2010

(87) PCT Pub. No.: WO2009/067747
PCT Pub. Date: Jun. 4, 2009

(65) Prior Publication Data
US 2010/0239003 A1    Sep. 23, 2010

(30) Foreign Application Priority Data
Nov. 30, 2007  (AU) ................................ 2007237289

(51) Int. Cl.
*H03M 13/29*  (2006.01)
*H04N 19/60*  (2014.01)
(Continued)

(52) U.S. Cl.
CPC ...... *H03M 13/2957* (2013.01); *H03M 13/1102* (2013.01); *H04N 19/00775* (2013.01); *H04N 19/59* (2014.11); *H04N 19/60* (2014.11);
(Continued)

(58) Field of Classification Search
CPC ..................... H03M 13/2957; H03M 13/1102; H04N 19/00775; H04N 19/00757; H04N 19/00933; H04N 19/59; H04N 19/60; H04N 19/89

See application file for complete search history.

(56) References Cited

U.S. PATENT DOCUMENTS 7,159,168 B2 *   1/2007  Whinnett et al. ............. 714/794
7,436,332 B2    10/2008  Lakus-Becker ................ 341/59
(Continued)

OTHER PUBLICATIONS

Brites, C., et al.; "Modeling Correlation Noise Statistics at Decoder for Pixel Based Wyner-Ziv Video Coding"; Picture Coding Symposium (PSC); Beijing, China; Apr. 24-26, 2006.*
(Continued)

*Primary Examiner* — Behrooz Senfi
*Assistant Examiner* — Maria Vazquez Colon
(74) *Attorney, Agent, or Firm* — Fitzpatrick, Cella, Harper & Scinto (57) ABSTRACT

A system (100) for encoding an input video frame (1005), for transmitting or storing the encoded video and for decoding the video is disclosed. The system (100) includes an encoder (1000) and a decoder (1200) interconnected through a storage or transmission medium (1100). The encoder (1000) includes a turbo encoder (1015) for forming parity bit data from the input frame (1005) into a first data source (1120), and a sampler (1020) for down-sampling the input frame (1005) followed by intraframe compression (1030) to form a second data source (1110). The decoder (1200) receives data from the second data source (1110) to form an estimate for the frame (1005). The decoder (1200) also receivers the parity bit data from the first data source (1120), and corrects errors in the estimate by applying the parity bit data to the estimate. Each bit plane is corrected in turn by a turbo decoder (1260). The decoder determines how reliably a pixel value was decoded, too. Frame reconstruction module (1290) takes advantage of this and discards unreliably decoded pixels and replaces them with predicted pixel values.

21 Claims, 6 Drawing Sheets

(51) Int. Cl.
*H03M 13/11* (2006.01)
*H04N 19/59* (2014.01)
*H04N 19/89* (2014.01)

(52) U.S. Cl.
CPC .......... *H04N19/89* (2014.11); *H04N 19/00757* (2013.01); *H04N 19/00933* (2013.01)

(56) References Cited

U.S. PATENT DOCUMENTS

| | | | |
|---|---|---|---|
| 2003/0012284 A1* | 1/2003 | Kazayama et al. ...... | 375/240.25 |
| 2003/0182617 A1* | 9/2003 | Kanaoka et al. ............. | 714/794 |
| 2005/0022101 A1* | 1/2005 | Malm et al. ................... | 714/801 |
| 2006/0114994 A1* | 6/2006 | Silverstein ............... | 375/240.12 |
| 2007/0067703 A1* | 3/2007 | Berkmann ........ | H03M 13/2975 714/794 |
| 2008/0055124 A1 | 3/2008 | Lakus-Becker ................. | 341/81 |
| 2009/0074077 A1 | 3/2009 | Lakus-Becker .......... | 375/240.25 |
| 2010/0034290 A1 | 2/2010 | Lakus-Becker .......... | 375/240.25 |
| 2010/0142839 A1 | 6/2010 | Lakus-Becker ............... | 382/244 |
| 2010/0158131 A1 | 6/2010 | Lakus-Becker et al. . | 375/240.25 |

OTHER PUBLICATIONS

Aaron, A. et al. ("Transform-domain Wyner-Ziv Codec for Video"; Proc. of SPIE-IS&T Electronic Imaging; SPIE vol. 5308; 2004).*

Ouaret et al. ("Codec-Independent Scalable Distributed Video Coding"; IEEE International Conference on Image Processing; vol. 3; pp. III-9-III-12; ICIP 2007).*

Brites, C., et al., "Modeling Correlation Noise Statistics at Decoder for Pixel Based Wyner-Ziv Coding", Picture Coding Symposium (PSC), Beijing, China, Apr. 24-26, 2006.

* cited by examiner

WYNER ZIV CODING

FIELD OF THE INVENTION

The present invention relates generally to video encoding and decoding and, in particular, to means of improving the reconstruction of pixel values after applying error correction methods.

BACKGROUND

Various products, such as digital cameras and digital video cameras, are used to capture images and video. These products contain an image-sensing device, such as a charge coupled device (CCD), which is used to capture light energy focussed of the image sensing device. The captured light energy, which is indicative of a scene, is then processed to form a digital image. Various formats are used to represent such digital images, or videos. Formats used to represent video include Motion JPEG, MPEG2, MPEG4 and H.264.

All the formats listed above have in common that they are compression formats. While those formats offer high quality and improve the number of video frames that can be stored on a given media, they typically suffer from long encoding runtimes.

A complex encoder typically requires complex hardware. Complex encoding hardware in turn is disadvantageous in terms of design cost, manufacturing cost and physical size of the encoding hardware. Furthermore, long encoding runtime delays the rate at which video frames can be captured while not overflowing a temporary buffer. Additionally, more complex encoding hardware has higher battery consumption. As battery life is important for a mobile device, it is desirable that battery consumption be minimized in mobile devices.

To minimize the complexity of the encoder, Wyner Ziv coding, also referred to as "distributed video coding", may be used. In distributed video coding the complexity of the encoder is shifted to the decoder.

In one example of distributed video coding, the input video stream is split into key frames and non-key frames. The key frames are compressed using a conventional coding scheme, such as Motion JPEG, MPEG2, MPEG4 or H.264. The decoder decodes the key frames in a conventional manner. The key frames are also referred to as "reference frames" in this specification. With the help of the key frames the non-key frames are predicted. The processing at the decoder is thus equivalent to carrying out motion estimation, which is usually performed at the encoder. The decoder improves the visual quality of the predicted non-key frames using error correction information provided by the encoder. The predicted non-key frame is also called the side information for the error correction.

The visual quality of the decoded video stream depends heavily on the quality of the prediction of the non-key frames and the level of quantization of the key frame image pixel values. The prediction of a non-key frame is often a rough estimate of the original non-key frame, this estimate being generated from adjacent frames such as the key frame, through motion estimation and interpolation. When there is a significant mismatch between a predicted non-key frame and the associated decoded key frame, it is necessary to resolve the mismatch.

In distributed video coding both the prediction errors (ie errors in the predicted non-key frames) and the error correction failures have to be rectified. Prior art approaches address these issues by a frame re-construction function that is performed after the Wyner-Ziv decoding. If the value of a predicted pixel (ie a pixel in a predicted non-key frame) is within a specified range of the associated decoded pixel (ie the pixel in the corresponding key frame), then the value of the reconstructed pixel is made equal to the value of the predicted pixel. Otherwise, the value of the reconstructed pixel is set equal to a pre-defined upper or lower bound of the decoded pixel, depending on the magnitude of the predicted value. This approach has the advantage of minimizing decoding errors and eliminates large positive or negative errors that are highly perceptible to human eyes. However, the solution is considered to be sub-optimal.

SUMMARY

It is an object of the present invention to substantially overcome, or at least ameliorate, one or more disadvantages of existing arrangements.

Disclosed are arrangements, referred to as Predicted Pixel Reliability (PPR) arrangements, which seek to address the above problems by (a) determining the reliability of a decoded pixel value on a bitwise basis, (b) deciding if this value is reliable, and if so defining the output pixel value to be the decoded value, and (c) if this value is unreliable, defining the output pixel value to be that of a reference/predicted pixel.

According to one aspect of the present invention, there is provided a method of distributed video turbo decoding where predicted pixel values are decoded with bitwise error correction methods, said method comprising the steps of:

associating each decoded pixel value with decoding reliabilities of at least one of its bits;

deciding which decoded pixels are unreliable based on said associated decoding reliabilities; and replacing the unreliably decoded pixels with the predicted pixels.

According to another aspect of the present invention, there is provided a method of distributed video turbo decoding the method comprising the steps of:

determining a reference/predicted pixel value based upon a source pixel;

determining a decoded pixel value based upon error correction information associated with the source pixel;

determining the reliability of the decoded pixel value;

if the decoded pixel value is reliable, defining an output pixel value based upon the decoded pixel value; and if the decoded pixel value is unreliable, defining the output pixel value based upon the reference pixel value.

According to another aspect of the present invention, there is provided an apparatus for distributed video turbo decoding, said apparatus comprising:

a memory for storing a program; and a processor for executing the program, said program comprising:

code for determining a reference pixel value based upon a source pixel;

code for determining a decoded pixel value based upon error correction information associated with the source pixel;

code for determining the reliability of the decoded pixel value;

code for, if the decoded pixel value is reliable, defining an output pixel value based upon the decoded pixel value; and code for, if the decoded pixel value is unreliable, defining the output pixel value based upon the reference pixel value.

According to another aspect of the present invention, there is provided a computer program product including a computer readable medium having recorded thereon a computer program for directing a processor to execute a method for distributed video turbo decoding, said program comprising:

code for determining a reference pixel value based upon a source pixel;

code for determining a decoded pixel value based upon error correction information associated with the source pixel;

code for determining the reliability of the decoded pixel value;

code for, if the decoded pixel value is reliable, defining an output pixel value based upon the decoded pixel value; and code for, if the decoded pixel value is unreliable, defining the output pixel value based upon the reference pixel value.

Other aspects of the invention are also disclosed.

BRIEF DESCRIPTION OF THE DRAWINGS

One or more embodiments of the present invention will now be described with reference to the drawings, in which.

DETAILED DESCRIPTION

Where reference is made in any one or more of the accompanying drawings to steps and/or features, which have the same reference numerals, those steps and/or features have for the purposes of this description the same function(s) or operation(s), unless the contrary intention appears.

It is to be noted that the discussions contained in the "Background" section and that above relating to prior art arrangements relate to discussions of documents or devices which may form public knowledge through their respective publication and/or use. Such discussions should not be interpreted as a representation by the present inventors or patent applicant(s) that such documents or devices in any way form part of the common general knowledge in the art.

Figure 1:
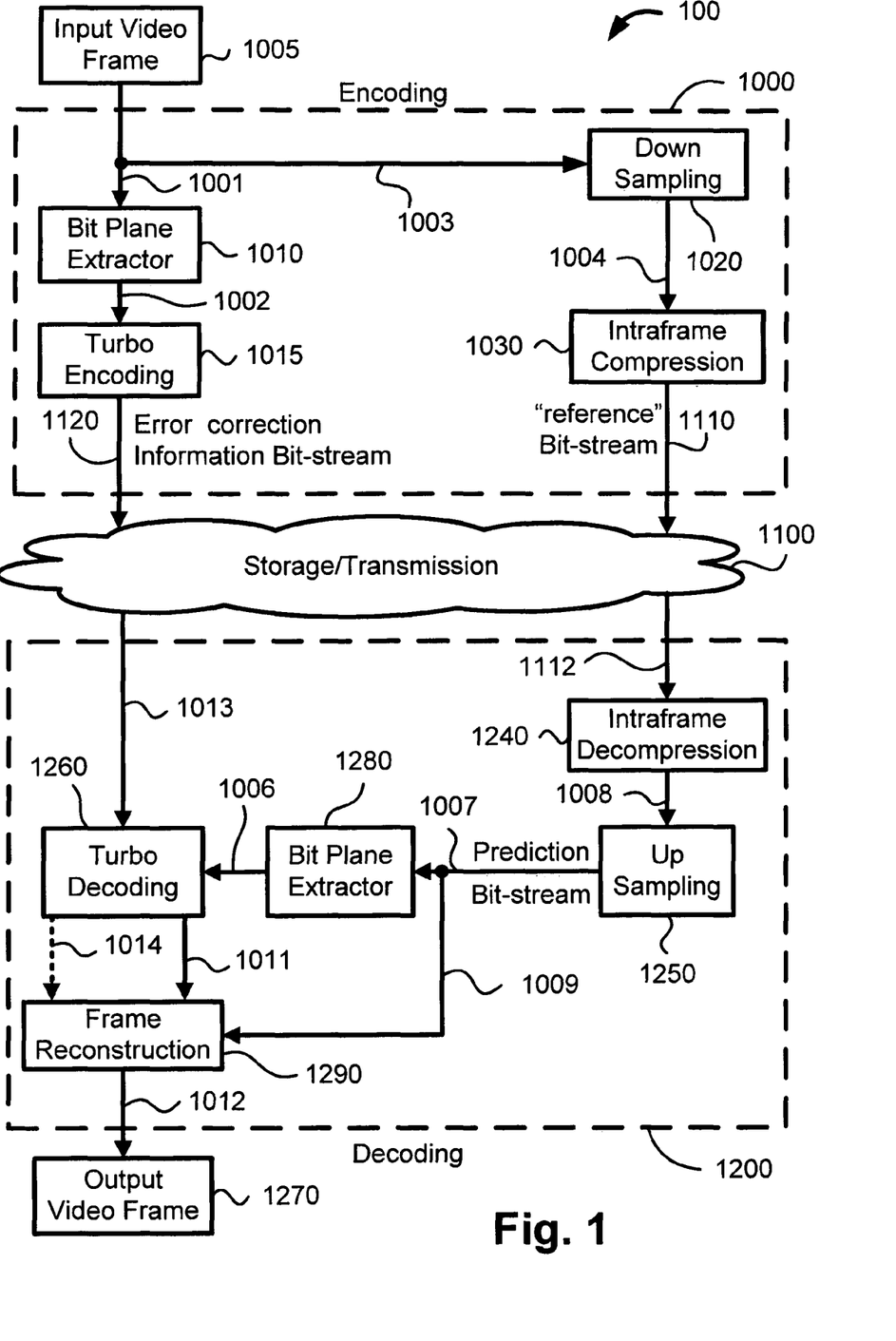
FIG. 1 shows a functional block diagram of a system for encoding an input video, for transmitting or storing the encoded video, and for decoding the video.

FIG. 1 shows a functional block diagram of a system 100 for encoding an input video, for transmitting or storing the encoded video and for decoding the video on a bitwise basis. The system 100 includes an encoder 1000 and a decoder 1200 interconnected through a storage or transmission medium 1100. The encoder 1000 forms two independently encoded bit-streams 1110 and 1120, which are jointly decoded by the decoder 1200. The bit-stream 1110 (also referred to as the reference bit-stream) relates to reference frames, and the bit-stream 1120 (also referred to as the error correction information bit-stream) relates to error correction information.

Figure 4:
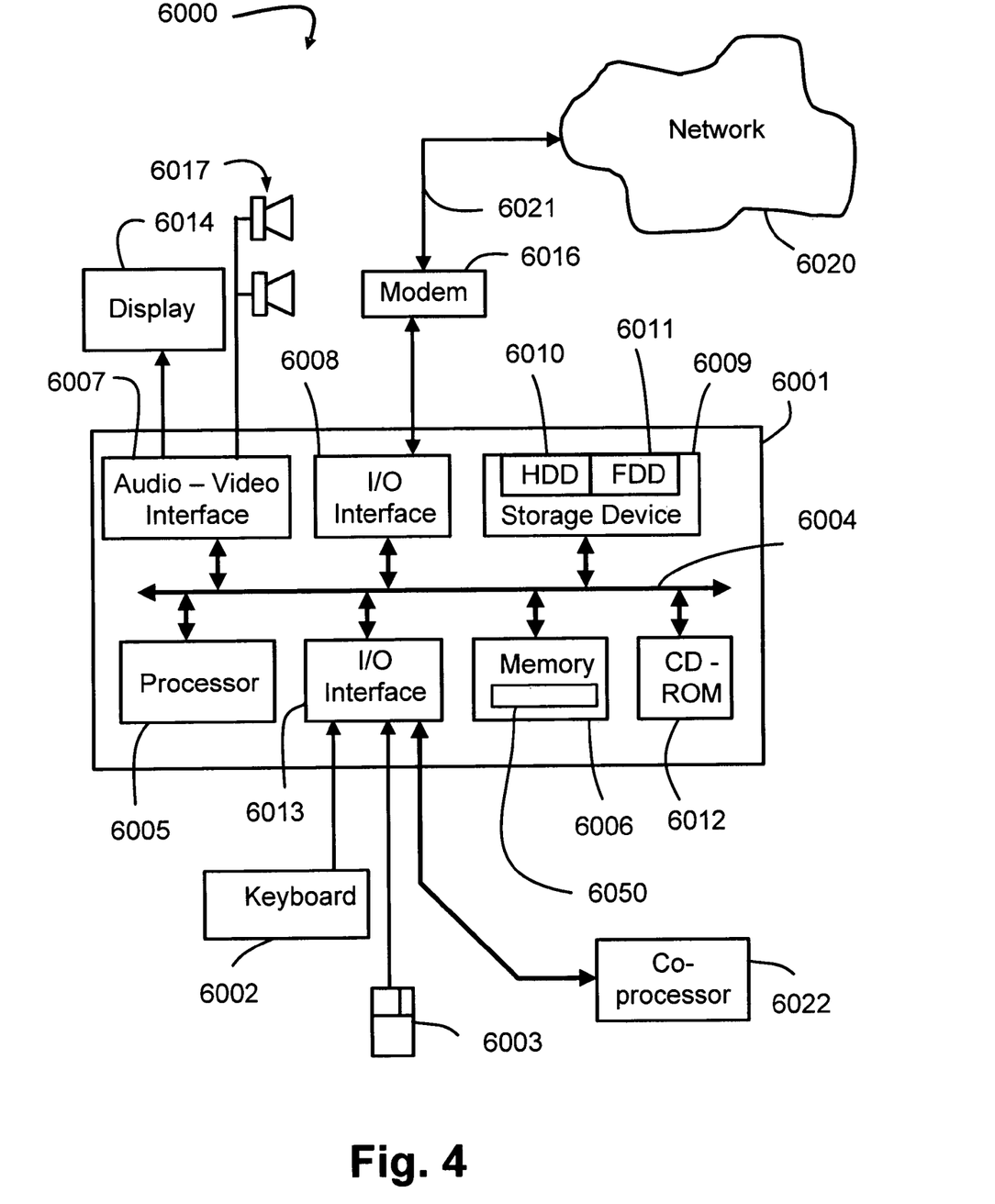
FIG. 4 shows a schematic block diagram of a general-purpose computer system upon which some or all of the system shown in FIG. 1 may be implemented.

The components 1000, 1100 and 1200 of the system 100 shown in FIG. 1 may be implemented using a computer apparatus system 6000, such as that shown in FIG. 4, wherein the encoder 1000 and decoder 1200 are implemented as software, such as one or more PPR application programs 6050 executable within the computer system 6000. The software PPR 6050 may be stored in a computer readable medium, including the storage devices described below, for example. The PPR software 6050 is loaded into the computer system 6000 from the computer readable medium, and then executed by the computer system 6000. A computer readable medium having such software or computer program recorded on it is a computer program product.

FIG. 4 shows the computer system 6000, which is formed by a computer module 6001, input devices such as a keyboard 6002 and a mouse pointer device 6003, and output devices including a display device 6014 and loudspeakers 6017. An external Modulator-Demodulator (Modem) transceiver device 6016 may be used by the computer module 6001 for communicating to and from a communications network 6020 via a connection 6021.

The computer module 6001 typically includes at least one processor unit 6005, and a memory unit 6006. The module 6001 also includes a number of input/output (I/O) interfaces including an audio-video interface 6007 that couples to the video display 6014 and loudspeakers 6017, an I/O interface 6013 for the keyboard 6002 and mouse 6003, and an interface 6008 for the external modem 6016. In some implementations, the modem 6016 may be incorporated within the computer module 6001, for example within the interface 6008. A storage device 6009 is provided and typically includes a hard disk drive 6010 and a floppy disk drive 6011. A CD-ROM drive 6012 is typically provided as a non-volatile source of data.

The components 6005, to 6013 of the computer module 6001 typically communicate via an interconnected bus 6004 and in a manner that results in a conventional mode of operation of the computer system 6000 known to those in the relevant art.

Typically, the PPR application program(s) 6050 discussed above are resident on the hard disk drive 6010 and read and controlled in execution by the processor 6005. Intermediate storage of such programs and any data fetched from the network 6020 may be accomplished using the semiconductor memory 6006, possibly in concert with the hard disk drive 6010. In some instances, the PPR application program(s) 6050 may be supplied to the user encoded on one or more CD-ROM and read via the corresponding drive 6012, or alternatively may be read by the user from the network 6020. Still further, the software can also be loaded into the computer system 6000 from other computer readable media. Computer readable media refers to any storage or transmission medium that participates in providing instructions and/or data to the computer system 6000 for execution and/or processing.

Examples of such computer readable storage media include floppy disks, magnetic tape, CD-ROM, a hard disk drive, a ROM or integrated circuit, USB memory, a magneto-optical disk, or a computer readable card such as a PCMCIA card and the like, whether or not such devices are internal or external of the computer module 6001. Examples of computer readable transmission media that may also participate in the provision of software, application programs, instructions and/or data to the computer module 6001 include radio or infra-red transmission channels as well as a network connection to another computer or networked device, and the Internet or Intranets including e-mail transmissions and information recorded on Websites and the like.

The system 100 shown in FIG. 1 may alternatively be implemented in dedicated hardware such as one or more integrated circuits operating as part of a co-processor 6022. Such dedicated hardware may include graphic processors, digital signal processors, or one or more microprocessors and associated memories. Alternately, the system 100 can be implemented using a hybrid arrangement of software and hardware modules.

In one implementation the encoder 1000 and the decoder 1200 are implemented within a camera (not illustrated), wherein the encoder 1000 and the decoder 1200 are implemented as software executing in a processor of the camera, or using hardware modules.

In a second implementation only the encoder 1000 is implemented within the camera, wherein the encoder 1000 may be implemented as software executing on a processor of the camera, or implemented using hardware. The decoder in this arrangement can, for example, be implemented as software running on the general-purpose computer 6000 in FIG. 4, or as the hardware co-processor 6022 communicating with the general-purpose computer 6000.

Referring again to FIG. 1, a source video frame 1005 is received as input to the system 100. The source video frame may be provided "on-the-fly" by the imaging system of a camera (not shown), or read from a memory such as 6010. Preferably every input video frame 1005 is processed by the system 100. In an alternative arrangement only every fifth input video frame is encoded using the system 100. In yet another alternative arrangement a selection of input video frames 1005 is made from the input video, with the selection of the input video frame 1005 depending on the video content. For example, if an occlusion of an object represented in the input video is observed, and if the extent of the observed occlusion is found to be above a threshold, then the input video frame 1005 is encoded using the system 100.

In the encoder 1000 the input video frame 1005 is provided, as depicted by an arrow 1003, to a sampler 1020 which down-samples the frame 1005 to form a down-sampled version 1004 of the input video frame 1005. The down-sampled version 1004 of the input video frame 1005 is then compressed using an intraframe compression module 1030 to form the reference bit-stream 1110. This bit-stream 1110 is respectively transmitted over, or stored in, the transmission or storage medium 1100 for decompression by the decoder 1200. The bit-stream 1110 plays a similar role to that of the "key frames" referred to earlier namely information that is transmitted which is later used as side information for error correction purposes.

In the preferred arrangement the sampler 1020 is implemented using a down-sampling filter with a cubic kernel. The default down-sampling rate is two, meaning that the image resolution at 1004 is reduced to one half of the original image resolution at 1003 in both the horizontal and vertical dimensions. A different down-sampling rate may be defined by a user. Alternative down-sampling methods may be employed by the sampler 1020, such as the nearest neighbour, bilinear, bi-cubic, and quadratic down-sampling filters using various kernels such as Gaussian, Bessel, Hamming, Mitchell or Blackman kernels. The compression employed by the intraframe compression module 1030 may be baseline mode JPEG compression, compression according to the JPEG2000 standard, or compression according to the H.264 standard.

Independently from the down-sampling in the sampler 1020 and the compression in the intraframe compression module 1030, parts of the selected input video frame 1005 are used to form the "error correction information" bit-stream 1120.

The original video frame 1005 is input, as depicted by an arrow 1001, to a bit plane extractor 1010 where each block of pixel coefficients is turned into a bit-stream 1002. Preferably scanning in the bit plane extractor 1010 starts on the most significant bit plane of the frame 1005 and concatenates the most significant bits of the coefficients of the frame 1005. This forms a first segment of the bit-stream 1002 containing the most significant bits. In a second pass the scanning concatenates the second most significant bits of all coefficients of the frame 1005. The bits from the second scanning path are appended as a second segment to the bit-stream segment generated in the previous scanning path.

The scanning and appending operations continue in this manner until the least significant bit plane is completed. This generates one bit-stream 1002 for each single input video frame 1005. In the preferred arrangement the scanning follows a raster scanning order wherein each single pixel is processed. In alternative arrangements the scanning path may be similar to the scanning path employed in the JPEG 2000 standard. In yet another alternative arrangement not every pixel is processed. The bit plane extractor 1010 is configured to extract a specified subset of pixels within each bit plane to generate the bit-stream 1002 in a manner that contains bits for spatial resolutions lower than the original resolution. With such a bit plane extractor it is possible to extract lower resolutions of the video frame such that a resolution embedded bit stream can be created for example.

The output bit-stream 1002 from the bit plane extractor 1010 is encoded in a turbo coder 1015 to produce the error correction information bit-stream 1120 in which, in the present example, the operative component is "parity information". This parity information is an example of forward error correction (FEC) in which error correction information is added to a bit-stream, such that errors can be repaired by the receiver of that stream with no further reference to the sender of the stream. In the arrangement of FIG. 1, for each single bit plane in the input video frame 1005, parity bits are produced. Accordingly, if the bit depth of the input video frame 1005 is eight, then eight sets of parity bits are produced of which each single parity bit set refers to one bit plane only. The parity bits output by the turbo encoder 1015 are then transmitted over to a storage or transmission medium 1100 in the bit-stream 1120. The bit-stream 1120 contains parity bits for the purpose of later error correction of the prediction whereas the prediction is generated out of information in the bitstream 1110. The bit-stream 1120 thus plays the same role as that of error correction information used to improve the quality of the "non-key frames".

Some or all of the modules in the encoder 1000, namely the sampler 1020, the compression module 1030, the bit plane extractor 1010, and the turbo encoder 1015, can be implemented in hardware in a coprocessor configuration 6022, or in software as part of the PPR software application 6050. In the latter case the processor 6005 performs the various module functions under control of the PPR software application 6050.

The operation of the turbo coder 1015 is described in greater detail with reference to FIG. 2.

The encoder 1000 thus forms two bit-streams 1110 and 1120, both derived from the same single input video frame 1005. The two bit-streams 1110 and 1120 from the intraframe compression module 1030 and the turbo coder 1015 respectively may be multiplexed into a single bit-stream, which is then stored in, or transmitted over, the storage or transmission medium 1100 to form respective bit-streams 1112 and 1013 in the component 1200.

Having presented an overview of the operation of the encoder 1000, an overview of the operation of the decoder 1200 is presented next. The decoder 1200 receives two inputs. The first input is the error correction information bit-stream 1013 (which is equivalent to the bit-stream 1120 from the turbo coder 1015), and the second input is the reference bit-stream 1112 (which is equivalent to the bit-stream 1110 from the intraframe compression module 1030).

The reference bit-stream 1112 is processed by an intraframe decompressor 1240 that performs the inverse operation to the intraframe compressor 1030 in a manner known in the art. Successively encoding and decoding the input video frame 1005 using the compression module 1030 and the decompression module 1240 leads to the intraframe decompressor 1240 providing an approximation 1008 of the down-sampled version 1004 of the input video frame 1005.

This approximation 1008 of the down-sampled version 1004 of the input video frame 1005 is then up-sampled by a sampler 1250. Preferably the sampler 1250 uses a cubic filter for the up-sampling. It is noted that the up-sampling method used by the sampler 1250 does not have to be the inverse of the down-sampling method used by the sampler 1020. For example, a bilinear down-sampling and a cubic up-sampling may be employed. The output 1007 from the sampler 1250 is an estimate of the input video frame 1005. This bit-stream 1007 is then input to a bit plane extractor 1280, which in the preferred arrangement is identical to the bit plane extractor 1010 of the encoder 1000. The output 1006 from the bit plane extractor 1280 can be stored in a buffer (not shown).

The decoder 1200 further includes a turbo decoder 1260, which is described later in detail with reference to FIG. 3. The turbo decoder 1260 operates on each bit plane of the predicted video frame in turn in order to decode at least a portion of that (current) bit plane. In a first iteration the turbo decoder 1260 receives, in the first segment of the bit-stream 1013, the parity bits for the first (most significant) bit plane as input. The turbo decoder 1260 also receives the first bit plane at 1006 from the bit plane extractor 1280 as side information. The turbo decoder 1260 uses the parity bits for the first bit plane in the first segment of the error correction information bit-stream 1013 to improve the approximation (received at 1006) of the first bit plane of the down-sampled version 1004 of the input video frame 1005, thereby outputting at 1011 a decoded first bit plane. The above process repeats for lower bit planes until all bit planes are decoded and output at 1011, thus producing a first decoded frame that approximates the original input frame 1005.

Within the turbo decoder 1260, iterations of two component decoders 3060 and 3070 (see FIG. 3) are employed. Those component decoders 3060, 3070 perform component decoding processes that produce likelihood information typically in the form of log likelihood values at 1014 (see Equation [1]) associated with each bit of a predicted pixel at 1011 that is decoded from the incoming error correction information bit-stream 1013. The log likelihood values 1014 indicate the confidence (i.e. reliability) with which the corresponding component decoder has correctly decoded a bit at 1011. The log likelihood values 1014 associated with a decoded bit are used to determine a reliability measure for a corresponding decoded pixel value 1011. If the log likelihood values at 1014 produced by component decoder one (3060) are not consistent (ie are inconsistent) with the corresponding log likelihood values produced by component decoder 2 (3070) then the pixel value at 1011 with which this bit is associated is considered to be unreliable. In one arrangement described in relation to FIG. 6, the aforementioned inconsistency (ie lack of consistency) is established if the log likelihood values at 1014 are found to be oscillating.

The frame reconstruction module 1290, which is described in detail with reference to FIG. 6 receives the decoded pixel value at 1011 from the turbo decoder 1260 as a first input, the log likelihood values (at 1014) corresponding to this pixel value as a second input, and the reference pixel value (at 1009) from the up-sampler 1250 as a third input. If the log likelihood values (at 1014) corresponding to the decoded pixel values (at 1011) are inconsistent (thus deciding or indicating that the decoded pixel value at 1011 is unreliable) then the decoded pixel value (at 1011) is discarded and the final pixel output value (at 1012) is set to be equal to the predicted pixel value (at 1009) in order to form the output video frame 1270. The output video frame 1270 is output to the display 6014, or alternately can be stored in memory such as 6010 or transmitted over the network 6020 to another machine or software application.

Some or all of the modules in the decoder 1200, namely the decompression module 1240, the up-sampler 1250, the bit-plane extractor 1280, the turbo-decoder 1260, and the frame reconstruction module 1290, can be implemented in hardware in the coprocessor 6022, or in software as part of the PPR software application 6050. In the latter case the processor 6005 performs the various module functions under control of the PPR software application 6050.

Having described the system 100 for encoding an input video (represented by the video frame 1005) to form two independently encoded bit-streams, and jointly decoding the bit-streams to provide an output video (represented by the video frame 1270), the turbo encoder 1015 of the system 100 is now described in greater detail.

Figure 2:
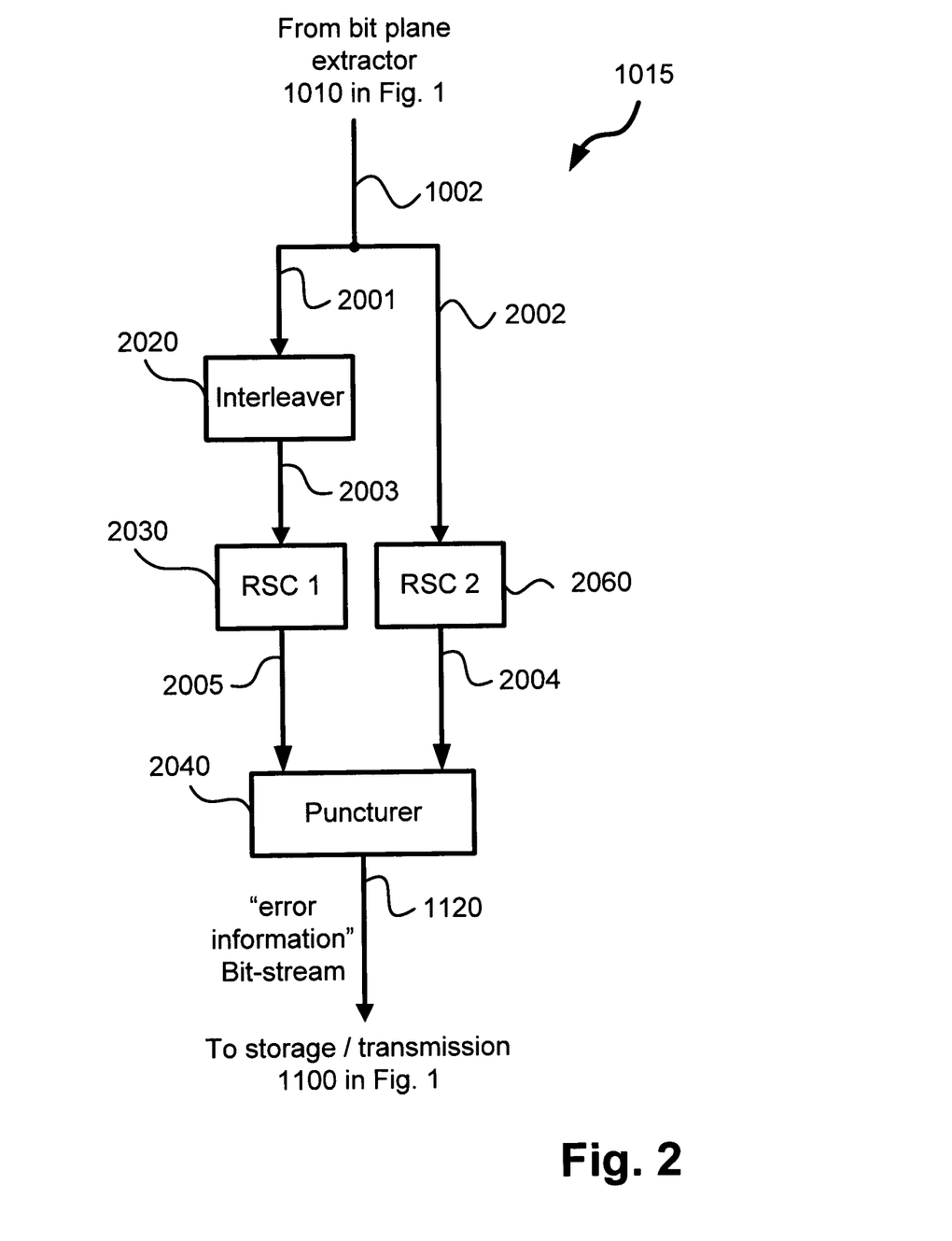
FIG. 2 shows a functional block diagram of the turbo encoder of the system in FIG. 1.

FIG. 2 shows a functional block diagram of the turbo coder 1015. The turbo coder 1015 receives an input bit-stream 1002 from the bit plane extractor 1010 (see FIG. 1). This bit-stream is provided, as depicted by an arrow 2001, to an interleaver 2020 that interleaves the bit-stream 2001. In the preferred arrangement this interleaver 2020 is a block interleaver. However, in alternative arrangements other suitable interleavers known in the art, for example random or pseudo-random interleavers, or circular-shift interleavers, may be used. The interleaver 2020 serves to randomise the bit-stream 2001.

The output 2003 from the interleaver 2020 is an interleaved bit-stream, which is passed on to a Recursive Systematic Coder RSC 2030 which produces, at 2005, parity bits. One parity bit per input bit is produced. In the preferred arrangement the recursive systematic coder 2030 is generated using the octal generator polynomials 7 (binary $111_2$) and 5 (binary $101_2$).

The bit-stream 1002 from the bit plane extractor 1010 is also provided, as depicted by an arrow 2002, to a second recursive systematic coder 2060. In the preferred arrangement the recursive systematic coders 2030 and 2060 are identical. The recursive systematic coders 2030 and 2060 output respective parity bit streams 2005, 2004 which are provided to a puncturer 2040. Each parity bit-stream 2005, 2004 is equal in length to the input bit-stream 1002.

The puncturer 2040 deterministically deletes parity bits from the parity bit-streams 2005, 2004 to reduce the parity bit overhead previously generated by the recursive systematic coders 2030 and 2060. Typically, so-called half-rate codes are employed by the puncturer 2040, which means that half the parity bits from each recursive systematic encoder 2030 and 2060 are punctured. In an alternative arrangement the puncturer 2040 may depend on additional information, such as the bit plane of the current information bit. In yet another alternative arrangement the scheme employed by the puncturer 2040 may depend on the spatial location of the pixel to which the information bit belongs, as well as the frequency content of the area around this pixel.

The turbo coder 1015 produces as output the punctured parity bit-stream 1120 (also referred to as the error correction information bit-stream), which comprises parity bits produced by the recursive systematic coders 2060 and 2030.

Figure 3:
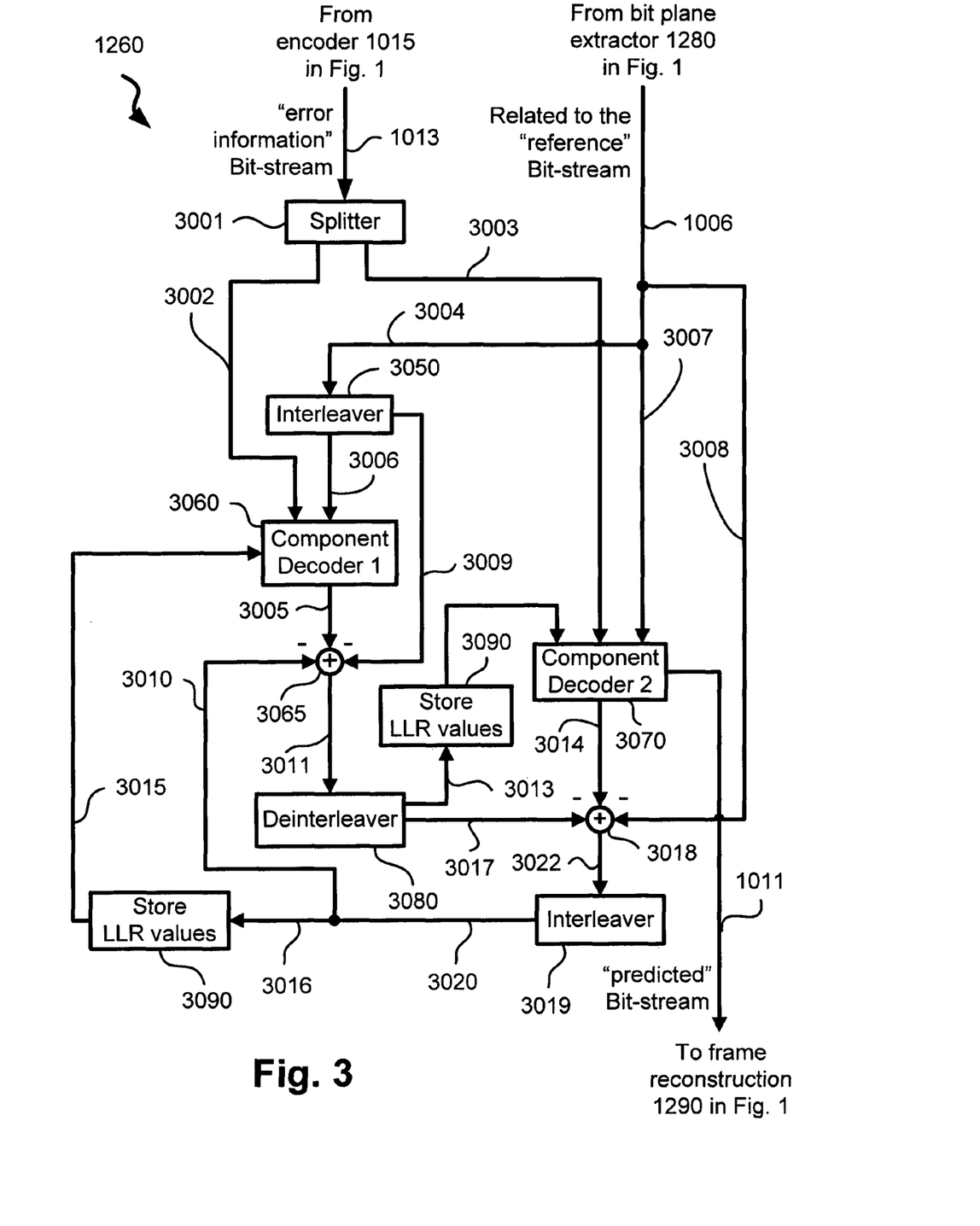
FIG. 3 shows a functional block diagram of the turbo decoder of the system in FIG. 1.

FIG. 3 shows a functional block diagram of the turbo decoder 1260. The parity bits in the bit-stream 1013 are split into two sets of parity bits 3002, 3003 by a splitter 3001. One of these sets 3002 originates from the recursive systematic coder 2030 (see FIG. 2) and the other set 3003 originates from the recursive systematic coder 2060 (see FIG. 2).

The parity bits 3002 are input to a first Component Decoder 3060, which preferably employs the Soft Output Viterbi Decoder (SOVA) algorithm known in the art. Alternatively, a Max-Log Maximum A Posteriori Probability (MAP) algorithm known in the art may be employed. In yet another alternative arrangement, variations of the SOVA or the MAP algorithms are used.

Systematic bits 1006 (which are related to the reference bit-stream 1110) from the bit plane extractor 1280 (see FIG. 1) are provided, as depicted by arrow segments 1006/3004, as input to an interleaver 3050. One output 3006 of this interleaver 3050 is directed to the first component decoder 3060. In a similar manner, the parity bits 3003 are input to a second Component Decoder 3070, together with the systematic bits as depicted by arrow segments 1006/3007.

The turbo decoder 1260 operates iteratively. One loop is formed starting from the component decoder 3060 to an adder 3065 via an arrow 3005, then from the adder 3065 to a deinterleaver 3080 via an arrow segment 3011. The loop continues from the deinterleaver 3080 to an LLR store 3090 via connection 3013 and further to the second component decoder 3070 and from the second component decoder 3070 to an adder 3018 via an arrow 3014. The loop continues from the adder 3018 to an interleaver 3019 via an arrow 3022, and from the interleaver 3019 via arrow segments 3020/3016 to a store 3090. The loop concludes from the store 3090 via an arrow 3015 back to component decoder 3060. The first component decoder 3060 receives three inputs. A first input is the parity bits 3002. A second input is the interleaved systematic bits 3006 from the interleaver 3050. The third input, depicted by an arrow 3015, originates from the second component decoder 3070. An output 3014 from the second decoder is directed to an adder 3018 whose output 3022 is directed to an interleaver 3019. An output of the interleaver 3019 is directed, via arrow segments 3016, to the LLR store 3090. The output 3015 of the store 3090 is directed to the first component encoder 3060.

The input 3015 (described as the third input above) originating from the second component decoder 3070 to the first component decoder 3060 provides likelihood information about the likely values of the bits to be decoded. This likelihood information is typically provided in terms of the Log Likelihood Ratios (also referred to as log likelihood values) which are defined as follows:

$$L(u_k) = \ln\left(\frac{P(u_k = +1)}{P(u_k = -1)}\right) \quad [1]$$

where $P(\mu_k=+1)$ denotes the probability that the bit $\mu_k$ equals +1 and where $P(\mu_k=-1)$ denotes the probability that the bit $\mu_k$ equals −1.

In the first iteration the feedback input (described as the third input above) from the second component decoder 3070 to the first component decoder 3060 does not exist. Therefore, in the first iteration the feedback input from the second component decoder 3070 is set to zero. The (decoded) bit sequence 3005 produced by the first component decoder 3060 is passed via the arrow 3005 to the adder 3065 where so called a priori information related to the bit-stream 1006 is produced at 3011. The systematic bits 1006, output as 3009 after interleaving in the interleaver 3050, are directed to the adder 3065. The information 3014 produced by the second component decoder 3070 (which is processed analogously in the adder 3018 and interleaved in the interleaver 3019) are extracted as well. Left over is the a priori information which gives the likely value of a bit. This information is valuable for the next decoder. In the preferred arrangement this a priori information (which is given in terms of a log likelihood ratios) and is stored in the LLR store 3090.

In a second arrangement in the store 3090 it is checked if the most recent log likelihood values are consistent with previously produced log likelihood values. If not then the corresponding bit is considered unreliable. The decoded pixel value (at 1011) to which the unreliable bit belongs is flagged as "unreliable". The unreliable decoded pixel value will be discarded and the "reference" pixel value (at 1009) will be used instead. The bit-stream output via 3011 from the adder 3065 is de-interleaved in the deinterleaver 3080, which performs the inverse action of the interleaver 3050. The de-interleaved bit-stream 3017 from the deinterleaver 3080 is stored in 3090 and then provided as input to the component decoder 3070.

In the preferred arrangement the component decoder 3070 as well as the adder 3018 operate analogously to the component decoder 3060 and the adder 3065 as already described. The resulting bit-stream 3022 is again interleaved in the interleaver 3019 whose output, depicted by arrow segments 3020/3016 are used as input for the second iteration to the first component decoder 3060.

In an alternative arrangement low density parity check (LDPC) codes can be used instead of turbo codes. LDPC codes are defined by a generator matrix, often denoted by H, which is sparse and which defines the parity checks. Often the generator matrix is a sparse random matrix. The encoding performance of random matrices is high which is good. However, the encoding complexity is also high which is undesirable. For this reason pseudo-random generator matrices are often used on the encoder side.

The decoding of an LDPC code is NP complete if the decoding is optimal. However, in practical applications, non-NP complete decoding techniques still achieve sufficient performance. One example of such a practically feasible decoding algorithm is the belief propagation algorithm which is a so called message passing algorithm.

In a message passing algorithm the input message is passed from the message nodes to the check nodes, then passed from the check nodes to the message nodes and so forth. The message that a belief propagation algorithms passes from a message node to a check node is the probability that the message bit (which is to be decoded) has a certain value given the observed value of that message node and all the values communicated to this message node in the prior round from check nodes. The probability that the message bit has a certain value can be used as a measure of decoding reliability for the value. Iterative decoding algorithms for turbo codes, such as forward-backward and Viterbi, are special cases of the belief propagation algorithm.

In the preferred arrangement eight iterations between the first component decoder 3060 and the second component decoder 3070 are carried out. After completion of eight iterations the resulting bit-stream produced from component decoder 3070 is output via 1011 (see FIG. 1).

Figure 5:
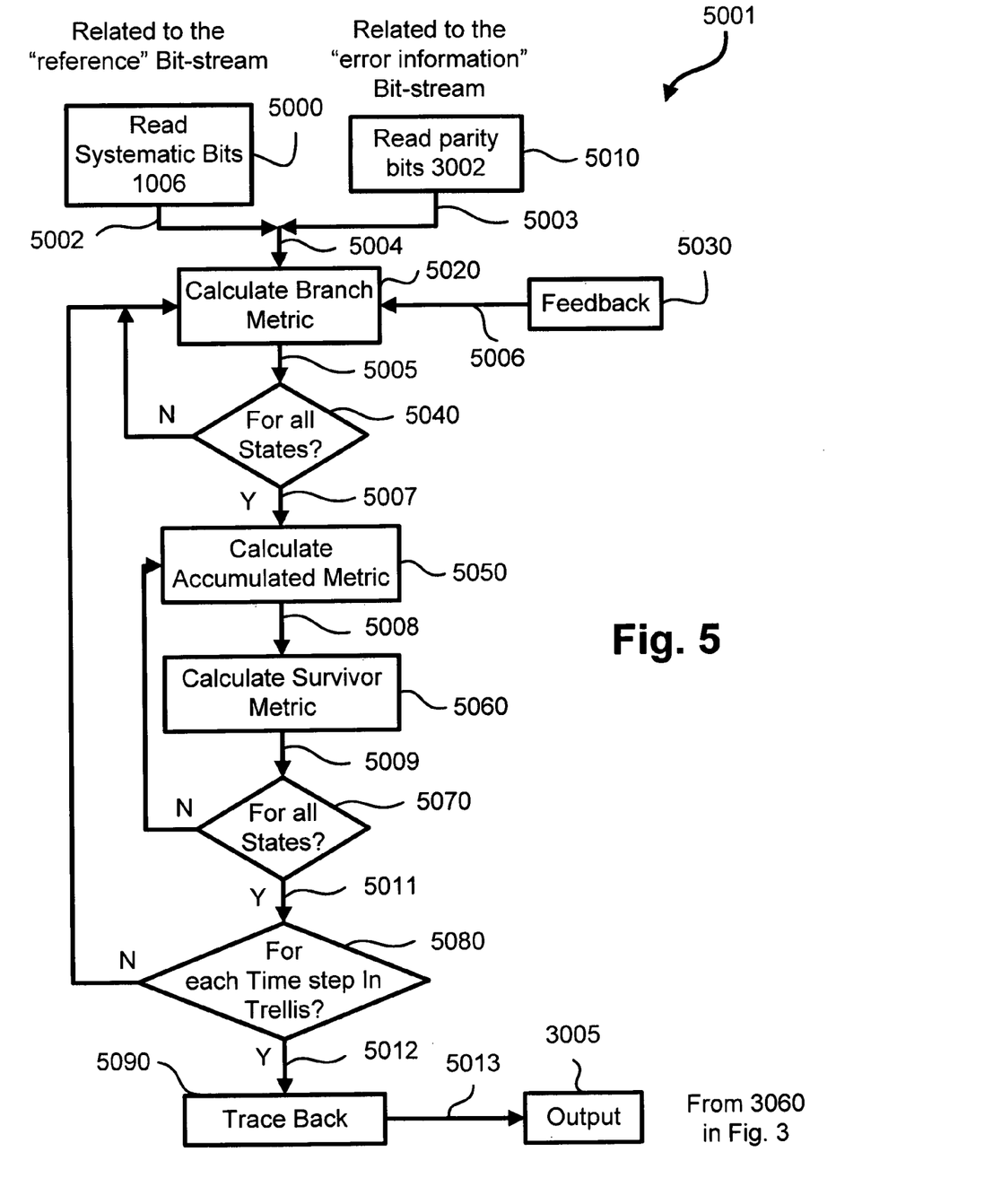
FIG. 5 shows a flow diagram for a process performed in a component decoder of the turbo decoder of FIG. 3.

FIG. 5 shows a flow diagram for a process 5001 that is performed by the first component decoder 3060 (see FIG. 3). As mentioned above the two component decoders 3060 and 3070 need not be identical. However, in the preferred arrangement the component decoders 3060 and 3070 are identical. The component decoder 3060 commences operation in a step 5000 by reading the systematic bits 1006 (FIG. 3), which are related to the reference bit-stream 1110 (see FIG. 1). As noted above, the systematic bits 1006 flow from the output of the up-sampler 1250 after transforming the pixel values to a new binary representation in the bit plane extractor 1280 (FIG. 1). In a parallel step 5010 the parity bits 3002 (FIG. 3), which are related to the error correction information bit-stream 1120, are read. Once the steps 5000 and 5010 are complete, processing continues in a following step 5020 that determines the so-called branch metric, this being known in the art. The branch metric is a measure of the decoding quality for the current symbol The branch metric is zero if the decoding of the current symbol is error free. Decoding errors can sometimes not be avoided and can still result in an overall optimal result.

The computation of the branch metric is performed by the step 5020 using feedback 5030 from the other component decoder 3070 (FIG. 3) in the form of the log likelihood ratios as described above. The log likelihood ratios, and as such the calculation of the branch metrics, is based on a model of the noise to be expected on the systematic bits 1006 (FIG. 3). In the preferred arrangement the Laplace noise model is employed to compensate for errors in the systematic bits 1006.

The noise to be expected on the systematic bits 1006 originates from JPEG compression and the respective down and up-sampling performed by 1020 and 1250 in FIG. 1. Modelling this noise is difficult, as reconstruction noise is generally signal dependent (e.g. because of the Gibbs phenomenon) and spatially correlated (e.g. as in the case of JPEG blocking). This means that in general the errors are not independent, or identically distributed. Channel coding techniques, e.g. turbo codes, typically assume independent, identically distributed noise.

Even though the magnitude of unquantized DC coefficients of the DCT coefficients are generally Gaussian distributed, it has been recognised that the magnitude of unquantized AC coefficients are best described by a Laplacian distribution. Furthermore the operation of quantizing coefficients typically decreases the standard deviation of those Laplacian distributions. This means that noise on DC coefficients may be modelled as Gaussian noise, and the noise on AC coefficients may be modelled as Laplace noise. Channel coding techniques, e.g. turbo codes, make the assumption that the noise is additive Gaussian white noise. It is thus disadvantageous to employ unmodified channel coding techniques.

As is evident from FIG. 1, the systematic bits 1006 used in the determination of the branch metric in the step 5020 of FIG. 5 originate from a spatial prediction process through the up-sampling performed in the sampler 1250.

Referring again to FIG. 5, the process 5001 follows an arrow 5005 from the step 5020 to a step 5040 which determines whether all states of a trellis diagram corresponding to the component decoders 3060 and 3070 have been processed. If all states have not been processed, then processing returns from the step 5040 via an "N" arrow back to the step 5020. If it is determined in the step 5040 that the branch metrics for all states have been calculated, then the process follows a "Y" arrow from the step 5040 to a step 5050 where an accumulated metric is computed. The accumulated metric represents the sum of previous code word decoding errors, which is the sum of previous branch metrics.

The process 5001 then follows an arrow 5008 from the step 5050 to a step 5060 in which the so called survivor path metric is calculated. This survivor path metric represents the lowest overall sum of previous branch metrics, this sum indicating the optimal decoding achieved to date.

Next, a step 5070 determines whether all states have been processed. If states remain for processing, then the process 5001, operating within the component decoder 3060, follows an "N" arrow from the step 5070 back to the step 5050. Once the computation of the branch metrics, is completed, the process 5001 follows a "Y" arrow from the step 5070 to a step 5080 which determines the accumulated metric and the survivor path metrics for a next time step in the trellis diagram. If time steps in the trellis remain which have not been processed, the process 5001 follows an "N" arrow from the step 5080 back to the step 5020. Once the step 5080 determines that the survivor metric has been determined for all nodes in the trellis diagram, the process 5001 follows a "Y" arrow from the step 5080 to a step 5090 which determines the "trace-back". The trace-back operation uses the best decoding metric indicating the decoding quality (determined via the survivor path metric determined in the step 5060) to generate the decoded bitstream. The output of the step 5090, following an arrow 5013, is the final output 3005 of the component decoder 3060. This completes the detailed description of the turbo decoder 1260.

Figure 6:
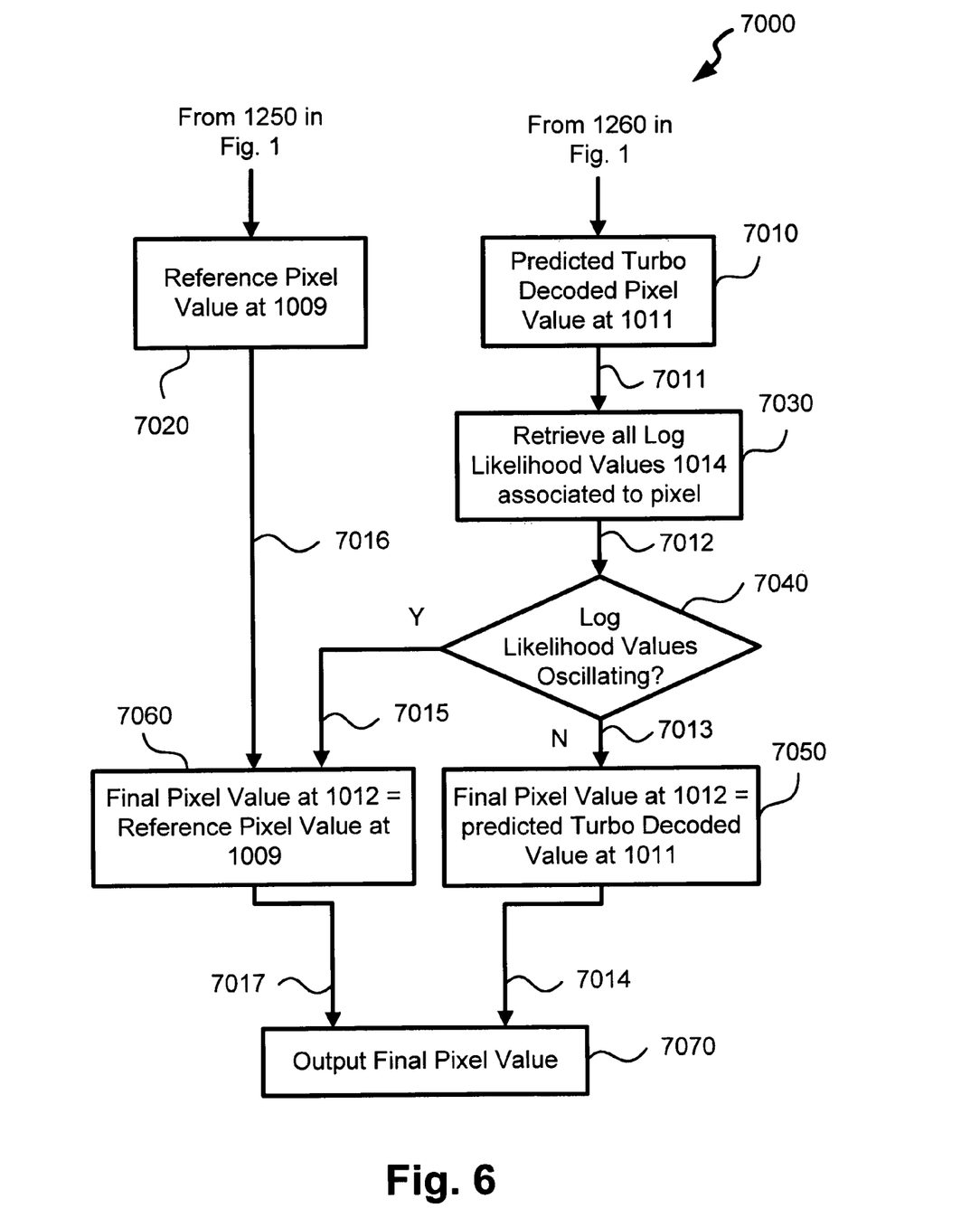
FIG. 6 shows a flow diagram for a pixel value reconstruction process.

The frame reconstruction module 1290 (see FIG. 1) is next described in more detail with reference to the process flow diagram of FIG. 6 showing the operations performed by the frame reconstruction module 1290. The frame reconstruction module 1290 computes the final output pixel values (at 1012 in FIG. 1), one output pixel value at a time.

The process 7000 used by the frame reconstruction module 1290 starts in a step 7010 which retrieves a predicted turbo decoded pixel value at 1011 from the module 1260 (see FIG. 1). Independently, in a step 7020, the frame reconstruction module 1290 takes a corresponding reference pixel value at 1009 from the up-sampling module 1250. Following the step 7010, as depicted by an arrow 7011, a subsequent step 7030 retrieves the log likelihood ratios (via 1014 in FIG. 1) associated with the current pixel value from the store 3090 in FIG. 3. If the turbo decoding module 1260 employed m iterations, then there are 2*m log-likelihood values per bit plane. The process 7000 then follows an arrow 7012 from the step 7030 to a step 7040 which checks if there is one bit of a pixel value in which the log likelihood values are inconsistent, i.e. oscillating. If there is one unreliable bit in any plane of a decoded pixel the decoded pixel value itself is considered unreliable and the process 7000 follows a "Y" arrow from the step 7040 to a step 7060. The step 7060 replaces the unreliable (decoded) pixel (at 1011 in FIG. 1) with the reference pixel value (at 1009). The process 7000 then follows an arrow 7017 from the step 7060 to a step 7070 that outputs the final pixel value at 1012 in FIG. 1.

Returning to the step 7040, if the step determines that the log likelihood values of the decoded pixel in question are not oscillating (ie that the decoded pixel value is reliable), then the process 7000 follows a "N" arrow from the step 7040 to a step 7050 which defines the final pixel value at 1012 (see FIG. 1) to be the decoded turbo-decoded value from 1011. The process 7000 then follows an arrow 7014 from the step 7050 to the step 7070.

In an alternative arrangement, instead of determining the reliability of a pixel in the frame reconstruction module 1290 in the step 7040 as shown, this step 7040 can be performed in the decoding module 1260. Then in the reconstruction module 1290 the unreliable pixel values are replaced, using the steps 7050, 7060 and 7070.

This concludes the detailed description of the frame reconstruction module 1290.

The foregoing describes only some arrangements of the present invention, and modifications and/or changes can be made thereto without departing from the scope and spirit of the invention, the arrangements being illustrative and not restrictive.

For example, instead of processing the same input video frame 1005 in order to produce the bitstreams 1110 and 1120, in an alternative arrangement the bitstream 1110 is formed from a key frame of the input video, whereas the bitstream 1120 is formed from non-key frames. In such an arrangement the data output from the up-sampler 1250 is an estimate of the non-key frames, and the turbo decoder 1260 uses the parity data from bitstream 1120 to correct the estimate.

INDUSTRIAL APPLICABILITY

It is apparent from the above that the arrangements described are applicable to the computer and data processing industries.

The foregoing describes only some embodiments of the present invention, and modifications and/or changes can be made thereto without departing from the scope and spirit of the invention, the embodiments being illustrative and not restrictive.

The invention claimed is:

1. A method of performing distributed video turbo decoding of an input video frame, the method comprising the steps of:
   forming an estimate of the input video frame according to received key frame data;
   determining a reference pixel value, from the estimate of the input video frame, based upon a source pixel of the input video frame;
   determining a decoded pixel value based upon error correction information associated with the source pixel, the error correction information being applied to the estimate of the input video frame to determine the decoded pixel;
   determining that a bit of the decoded pixel value is not reliable if a log likelihood value of the bit, produced by the determining of the decoded pixel value based upon error correction information, is oscillating when compared with a previously produced log likelihood value of the bit;
   determining that the decoded pixel value is not reliable if the determined bit of the decoded pixel value is not reliable; and
   defining a value of an output pixel depending upon a reliability of the decoded pixel value, wherein if the decoded pixel value is reliable, the output pixel value is based upon the decoded pixel value, and if the decoded pixel value is not reliable, the output pixel value is based upon the reference pixel value.

2. The method according to claim 1, wherein:
   the source pixel belongs to a key frame in a sequence of video frames; and
   the error correction information is derived from non-key frames associated with the key frame.

3. The method according to claim 1, wherein the step of determining the reference pixel comprises successively encoding and decoding the source pixel value using one of baseline mode JPEG coding, JPEG2000 standard coding, or H.264 standard coding.

4. The method according to claim 3, wherein the step of determining the reference pixel further comprises down-sampling the source pixel prior to the encoding step, and up-sampling the source pixel after the decoding step.

5. The method according to claim 1, wherein the error correction information associated with the source pixel comprises parity information determined by turbo coding bit plane coefficients of the source pixel.

6. The method according to claim 1, wherein the step of determining that the decoded pixel value is not reliable comprises the steps of:
   determining likelihood information for each of two component decoding processes used by the turbo decoding method;
   determining that the decoded pixel value is reliable if the likelihood information associated with one said component decoding process is consistent with the likelihood information associated with the other said component decoding process; and
   determining that the decoded pixel value is not reliable if the likelihood information associated with one said component decoding processes is inconsistent with the likelihood information associated with the other said component decoding process.

7. The method according to claim 1, wherein the decoded pixel is determined not to be reliable if at least one bit of the decoded pixel is not reliable.

8. An apparatus for performing distributed video turbo decoding of an input video frame, said apparatus comprising:
   a memory for storing a program; and
   a processor for executing the program, said program comprising:
   code for forming an estimate of the input video frame according to received key frame data;
   code for determining a reference pixel value, from the estimate of the input video frame, based upon a source pixel of the input video frame;
   code for determining a decoded pixel value based upon error correction information associated with the source pixel, the error correction information being applied to the estimate of the input video frame to determine the decoded pixel;
   code for determining that a bit of the decoded pixel value is not reliable if a log likelihood value of the bit, produced by the determining of the decoded pixel value based upon error correction information, is oscillating when compared with a previously produced log likelihood value of the bit;
   code for determining that the decoded pixel value is not reliable if the determined bit of the decoded pixel value is not reliable; and
   code for defining a value of an output pixel depending upon a reliability of the decoded pixel value, wherein if the decoded pixel value is reliable, the output pixel value is based upon the decoded pixel value, and if the decoded pixel value is not reliable, the output pixel value is based upon the reference pixel value.

9. The apparatus according to claim 8, wherein:
   the source pixel belongs to a key frame in a sequence of video frames; and
   the error correction information is derived from non-key frames associated with the key frame.

10. The apparatus according to claim 8, wherein the code for determining the reference pixel comprises successively encoding and decoding the source pixel value using one of baseline mode JPEG coding, JPEG2000 standard coding, or H.264 standard coding.

11. The apparatus according to claim 10, wherein the code for determining the reference pixel further comprises down-sampling the source pixel prior to the encoding step, and up-sampling the source pixel after the decoding step.

12. The apparatus according to claim 8, wherein the error correction information associated with the source pixel comprises parity information determined by turbo coding bit plane coefficients of the source pixel.

13. The apparatus according to claim 8, wherein the code for determining that the decoded pixel value is not reliable comprises:

code for determining likelihood information for each of two component decoding processes used by the turbo decoding method;

code for determining that the decoded pixel value is reliable if the likelihood information associated with one said component decoding process is consistent with the likelihood information associated with the other said component decoding process; and code for determining that the decoded pixel value is not reliable if the likelihood information associated with one said component decoding processes is inconsistent with the likelihood information associated with the other said component decoding process.

14. The apparatus according to claim 8, wherein the decoded pixel is determined not to be reliable if at least one bit of the decoded pixel is not reliable.

15. A non-transitory computer readable storage medium having recorded thereon a computer program for directing a processor to execute a method for performing distributed video turbo decoding of an input video frame, said program comprising:

code for forming an estimate of the input video frame according to received key frame data;

code for determining a reference pixel value, from the estimate of the input video frame, based upon a source pixel of the input video frame;

code for determining a decoded pixel value based upon error correction information associated with the source pixel, the error correction information being applied to the estimate of the input video frame to determine the decoded pixel;

code for determining that a bit of the decoded pixel value is not reliable if a log likelihood value of the bit, produced by the determining of the decoded pixel value based upon error correction information, is oscillating when compared with a previously produced log likelihood value of the bit;

code for determining that the decoded pixel value is not reliable if the determined bit of the decoded pixel value is not reliable; and code for defining a value of an output pixel depending upon a reliability of the decoded pixel value, wherein if the decoded pixel value is reliable, the output pixel value is based upon the decoded pixel value, and if the decoded pixel value is not reliable, the output pixel value is based upon the reference pixel value.

16. The computer readable storage medium according to claim 15, wherein:

the source pixel belongs to a key frame in a sequence of video frames; and the error correction information is derived from non-key frames associated with the key frame.

17. The computer readable storage medium according to claim 15, wherein the code for determining the reference pixel comprises successively encoding and decoding the source pixel value using one of baseline mode JPEG coding, JPEG2000 standard coding, or H.264 standard coding.

18. The computer readable storage medium according to claim 17, wherein the code for determining the reference pixel further comprises down-sampling the source pixel prior to the encoding step, and up-sampling the source pixel after the decoding step.

19. The computer readable storage medium according to claim 15, wherein the error correction information associated with the source pixel comprises parity information determined by turbo coding bit plane coefficients of the source pixel.

20. The computer readable storage medium according to claim 15, wherein the code for determining that the decoded pixel value is not reliable comprises:

code for determining likelihood information for each of two component decoding processes used by the turbo decoding method;

code for determining that the decoded pixel value is reliable if the likelihood information associated with one said component decoding process is consistent with the likelihood information associated with the other said component decoding process; and code for determining that the decoded pixel value is not reliable if the likelihood information associated with one said component decoding processes is inconsistent with the likelihood information associated with the other said component decoding process.

21. The computer readable storage medium according to claim 15, wherein the decoded pixel is determined not to be reliable if at least one bit of the decoded pixel is not reliable.

* * * * *